United States Patent [19]

Sarkoezi

[11] Patent Number: 5,057,703

[45] Date of Patent: Oct. 15, 1991

[54] WORKING/STANDBY CLOCK PULSE SUPPLY FOR DIGITAL SYSTEMS

[75] Inventor: Imre Sarkoezi, Munich, Fed. Rep. of Germany

[73] Assignee: Siemens Aktiengesellschaft, Munich

[21] Appl. No.: 567,973

[22] Filed: Aug. 15, 1990

[30] Foreign Application Priority Data

Aug. 28, 1989 [DE] Fed. Rep. of Germany ....... 3928401

[51] Int. Cl.$^5$ .......................... H03K 3/00; H04L 1/00
[52] U.S. Cl. ...................................... 307/269; 328/61; 328/104
[58] Field of Search ............... 307/480, 481, 268, 269, 307/296.4, 520, 529, 441, 219; 328/61, 104; 377/47

[56] References Cited

U.S. PATENT DOCUMENTS

| 4,156,200 | 5/1979 | Gomez | 328/104 |
| 4,305,041 | 12/1981 | Frerking | 328/61 |
| 4,511,847 | 4/1985 | Rantala | 307/529 |
| 4,691,126 | 9/1987 | Splett et al. | 307/480 |
| 4,882,738 | 11/1989 | Suzuki | 307/269 |
| 4,949,052 | 9/1990 | Chigira | 328/104 |

FOREIGN PATENT DOCUMENTS 3700457 6/1988 Fed. Rep. of Germany .

OTHER PUBLICATIONS

Conover, J., "Einführung in die Technik von Abtastfiltern", Nachrichten Elektronik, vol. 35, No. 7, 1981, pp. 270–272.

Primary Examiner—Stanley D. Miller
Assistant Examiner—Andrew Sanders
Attorney, Agent, or Firm—Hill, Van Santen, Steadman & Simpson

[57] ABSTRACT

A working/standby clock pulse supply for digital systems, particularly for synchronous multiplex systems and switching systems, has a working clock oscillator and a standby oscillator. The working clock signal or the standby clock signal is guided by way of assemblies whereby at least one clock signal summing circuit is provided which adds equal harmonic spectral signals of various amplitudes of the working clock signal and the standby clock signal to provide a resulting spectral signal.

11 Claims, 4 Drawing Sheets

WORKING/STANDBY CLOCK PULSE SUPPLY FOR DIGITAL SYSTEMS

BACKGROUND OF THE INVENTION

1. Field of the Invention

The present invention relates to a working/standby clock pulse supply for digital systems with an operating clock oscillator which supplies an operating clock signal and with a standby oscillator which supplies a standby clock signal and with at least one assembly to which the working clock signal and the standby clock signal are supplied.

2. Description of the Prior Art

In digital data processing systems, multiplex systems, switching systems and, particularly, cross-connect multiplex systems in synchronous networks, generally a standby clock pulse supply is provided. In larger systems, several equipment packs operate in synchronous fashion with a clock pulse, whereby it is possible to process data signals in parallel. In order to achieve a higher operational dependability, two or more central clock signals that are coupled with each other are offered to all units. The central clock signals are provided by crystal oscillators (VCO's) which, for their part, are synchronized to a highly-accurate standard clock signal. If the standard frequency fails, the frequency accuracy of the crystal oscillators is sufficiently high at first to guarantee a further operation of the system. If the operating clock pulse oscillator fails, if it is being repaired or in the case of an interruption of the clock signal path, it has so far been usual to switch over to standby clock signals. Hereby, usually-heavy disturbances occur during the transition from the operating clock signal to the standby clock signal which could lead to a higher loss of bits and therefore also to a loss of synchronism. Since all assemblies must be provided with the same clock pulse failure circuit, a simple and inexpensive solution is necessary.

SUMMARY OF THE INVENTION

It is the object of the present invention to provide a simple working/standby clock signal supply which enables the use of the standby clock signal without bit errors and which can be realized in a simple manner.

The above problem is solved and the above object is achieved by a working/standby clock pulse supply as generally set forth above which is particularly characterized in that at least one clock signal summing circuit is provided which combines predetermined harmonic spectral portions of various amplitudes of the working clock signal and of the standby clock signal or of spectral signals derived therefrom to one resulting signal and which derives a resulting clock signal from the resulting signal.

According to a particular feature of the invention, such a working/standby clock pulse supply is particularly characterized in that a first spectral conversion transducer and a second spectral conversion transducer are provided which convert the working clock signal and the standby clock signal into spectral signals corresponding to fundamental oscillations or even harmonic oscillations.

According to another feature of the invention, a working/standby clock pulse supply, as set forth above, is particularly characterized in that the first spectral conversion transducer and the second spectral conversion transducer provides square-wave pulses with a 1:1 clock pulse ratio as spectral signals.

According to another feature of the invention, the working/standby clock pulse supply, as described above, is particularly characterized in that as a first spectral conversion transducer and/or as a second spectral conversion transducer, a limiter amplifier with a following signal modifier are provided.

According to another feature of the invention, as described above, the working/standby clock pulse supply is particularly characterized in that the amplitude ratio of the harmonics to be added or the harmonic spectral shares is 2:1.

According to another feature of the invention, as described above, the working/standby clock pulse supply is particularly characterized in that as spectral signals amplitude-limited square-wave pulses of various durations are logically combined.

According to another feature of the invention, the working/standby clock pulse supply, as described above, is particularly characterized in that a third spectral conversion transducer is provided which is supplied with the resulting spectral signal and includes a filter for the selection of the desired harmonics.

According to another feature of the invention, the working/standby clock pulse supply, as described above, is particularly characterized in that as a filter, an oscillating circuit is provided.

According to another feature of the invention, the working/standby pulse supply, as described above, is particularly characterized in that in the signal summing circuit, a transistor is provided as an adder in a common base configuration whose emitter is supplied with the spectral signals to be added via ohmic resistors, and in that a tank circuit is connected to the collector of the transistor.

It is advantageous that the change-over event is replaced by an addition. If one of the clocks fails, a continuous transition to the other clock takes place. The maximum theoretical phase shift can only be 180°.

It is advantageous that the phase shift is transformed into a slow phase modification by a filter.

It is also advantageous when the fundamental oscillations of the square-wave signals to be added are used since their spectrum shares prevail.

For specific applications, particularly when several phase-shifted clocks are needed in the system, the first harmonic oscillation or another harmonic oscillation can be used as well to obtain a resulting clock with the double or multiple system frequency.

BRIEF DESCRIPTION OF THE DRAWINGS

Other objects, features and advantages of the invention, its organization, construction and operation will be best understood from the following detailed description, taken in conjunction with the accompanying drawings, on which.

DESCRIPTION OF THE PREFERRED EMBODIMENT

Figure 1:
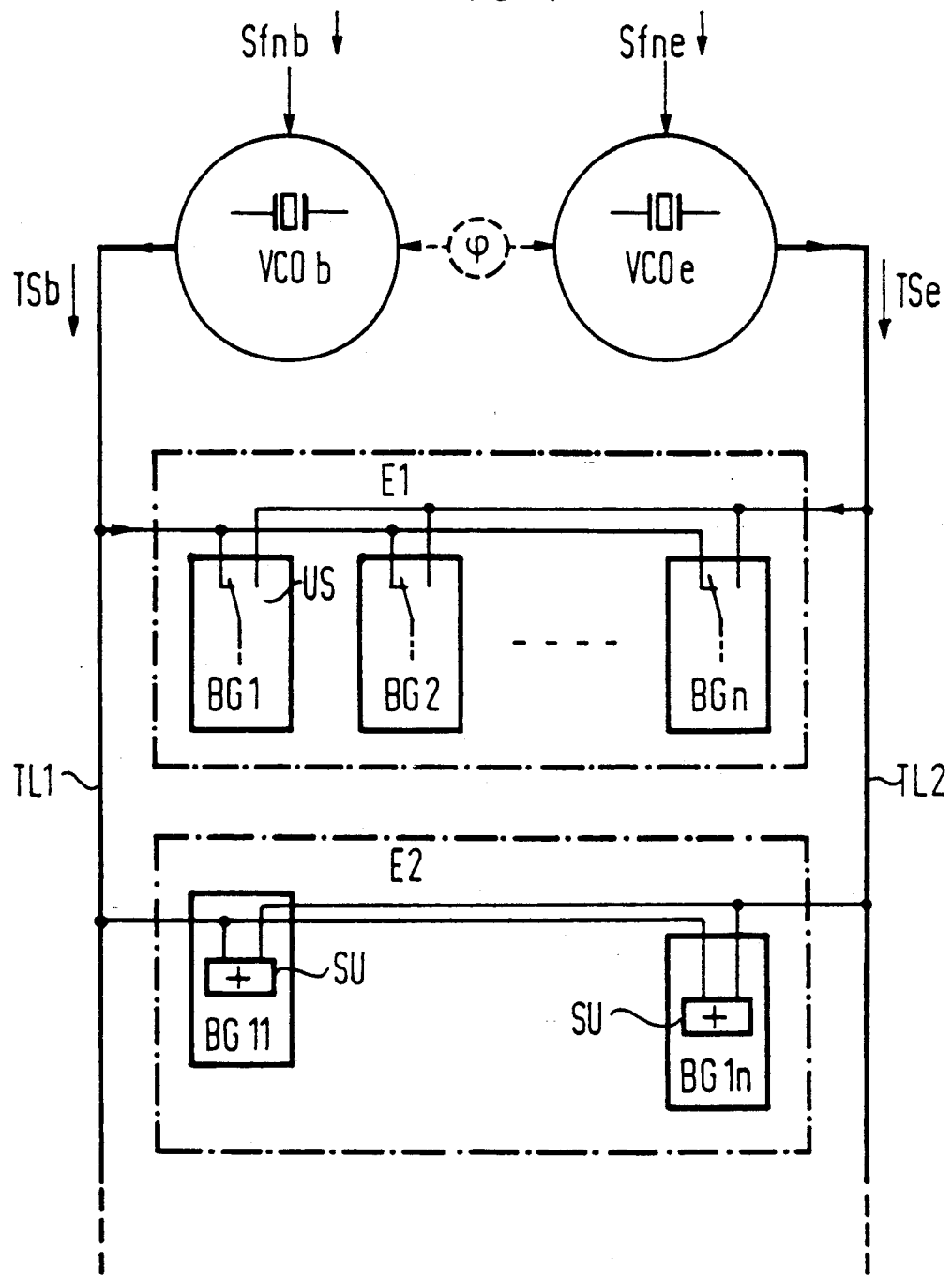
FIG. 1 is a schematic representation of a working/standby clock pulse supply.

Referring to FIG. 1, a working/standby clock pulse supply comprises a first equipment pack E1 including several assemblies BG1–BGn. Each of the assemblies BG1–BGn is supplied with a working clock signal TSb from a working clock pulse oscillator VCO b via a first clock pulse line TL1 and a standby clock signal TSe via a second clock pulse line TL2 from a standby oscillator VCO e.

In the second equipment pack E2, the change-over switches US of the assemblies BG11–BG1n have been replaced by a respective clock signal summing circuit SU. In most cases, each assembly which can contain several printed circuitboards will be allocated a summing circuit SU. Depending on the safety requirements and technological necessities, also those solutions are conceivable whereby several assemblies or one equipment pack is/are allocated only one summing circuit.

Figure 2:
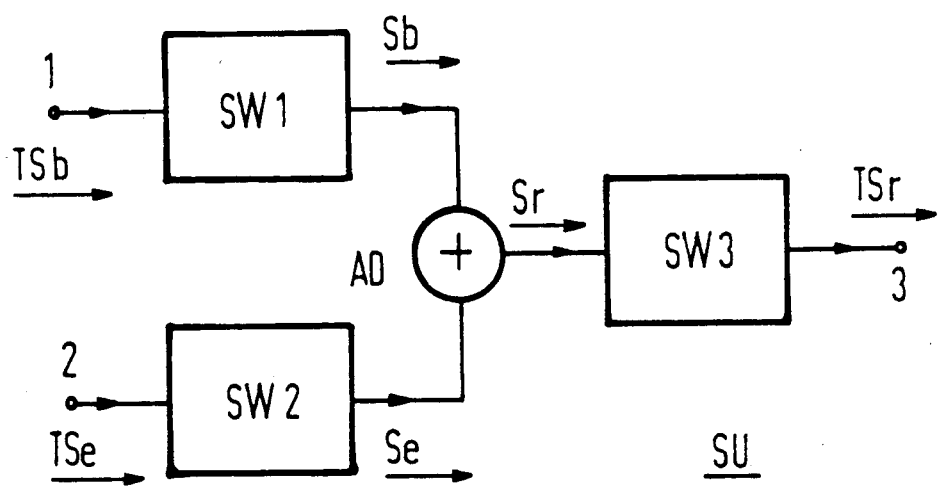
FIG. 2 is a basic block circuit diagram of a clock signal adding circuit.

A schematic diagram of the clock signal summing circuit SU is illustrated in FIG. 2. The clock signal summing circuit SU comprises three spectral conversion transducers and one adder. The outputs of the first spectral conversion transducer SW1 and of the second spectral conversion transducer SW2 are combined via an adder AD whose output is connected to the input of the third spectral conversion transducer SW3.

Figure 3:
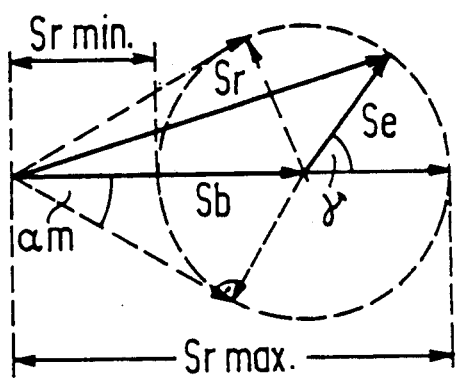
FIG. 3 is a vector diagram for the clock signal addition.

The input 1 of the first spectral conversion transducer SW1 is supplied with the working clock signal TSb and the input 2 of the second spectral conversion transducer SW2 is supplied with the standby clock signal TSe. At the output 3, a resulting clock signal TSr is available with the frequency of the fundamental oscillation or of a harmonic oscillation. For that, the spectral portions of the desired harmonics are added in weighted fashion and the undesired harmonics are discriminated against. The discrimination can occur before or after the addition. In the first case, the spectral conversion transducers SW1, SW2 discriminate against the undesired harmonics; in the second case, they deliver pulses in which the desired harmonic is contained with an optimally-high portion. In the second spectral conversion transducer, the amplitude of the selected or to be selected harmonics is decreased, for example, as shown in FIG. 3, halved. The standby spectral signal Se thereby obtained is added to the working spectral signal Sb which is supplied by the first spectral conversion transducer. The resulting signal Sr, always the resulting selected harmonic is understood as such, is converted, in the third spectral conversion transducer SW3 for example again into a square-wave signal which is output at the output 3 of the clock signal summing circuit as the resulting clock signal TSr.

The vector diagram of FIG. 3 applies to a ratio of amplitude of 2:1 of the working spectral signal Sb to the standby spectral signal Se. The phase difference $v$ between the spectral signals can lie between 0° and 180° corresponding to the phase difference between the clock signal. Given a phase coincidence, both signals add up to a maximal resulting signal Sr max; given anti-phase signals, merely a minimal resulting signal Sr min remains. As long as both spectral signals are present, merely phase variations of $\pm a_m = \pm 30°$ can result.

The smaller the standby spectral signal Se, the smaller are the phase variations. When the working clock signal TSb fails and therefore the working spectral signal, the remaining standby spectral signal must be in the position to control the third spectral conversion transducer however. A ratio of Sb:Se > 1.5 is therefore favorable. A ratio of 2:1 is very favorable since in the case of a failure of the signal TSb as well as in the case of anti-phase clock signals, the resulting signal Sr is equal.

Figure 4:
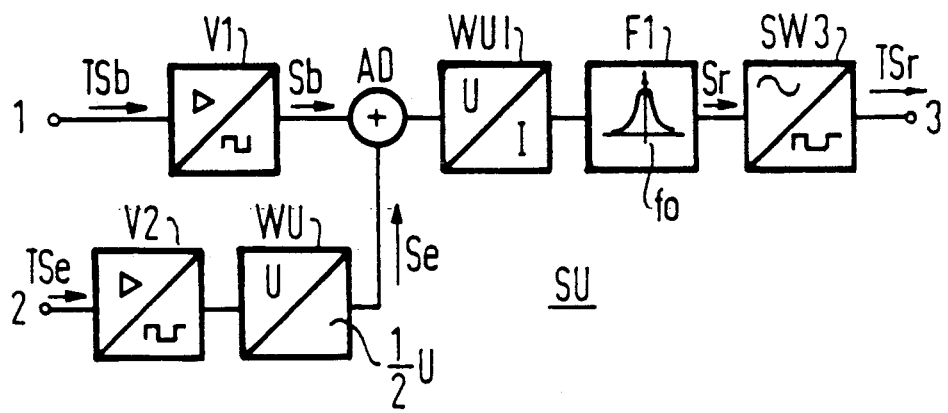
FIG. 4 is a block circuit diagram of the clock signal adding circuit.

The clock signal summing circuit is illustrated in FIG. 4 in block diagram form. The clock signals TSb and TSe are respectively supplied by way of respective inputs 1 and 2 to a pair of amplifiers V1 and V2 which operate as a delimiter and potentially also serve as level changers. The second amplifier V2 is followed by a voltage transformer WU. Its output and the output of the first amplifier are connected with inputs of the adder AD. At the output of the adder AD, the serial connection of a voltage-current converter WUI, a filter FI and a third spectral conversion transducer SW3 is connected.

The spectral signals Sb and Se are added in the form of square-wave pulses and supplied via the voltage-current converter WUI to the filter FI which is constructed as an oscillation circuit whose resonant frequency corresponds to the selected harmonic and which supplies the resulting clock signal Sr. Here, the second principle is realized by addition of square-wave signals and discrimination with respect to the desired harmonics. This circuit arrangement results in a minor design effort.

According to the vector diagram, a phase shift of less than 180° can occur when the working clock signal TSb fails. Due to the third spectral conversion transducer SW3, this phase shift is converted, however, into a continuously-occurring phase modification (whereby the conditions of the oscillation circuit and the drive determine the speed of the change). Moreover, the possibility exists in the case of a larger phase difference, unfavorable is a phase difference of 180° whereby a phase shift occurs, between the working spectral signal and the working standby signal to shift the working standby signal in phase, whereby its inverting would always have to be sufficient.

Figure 5:
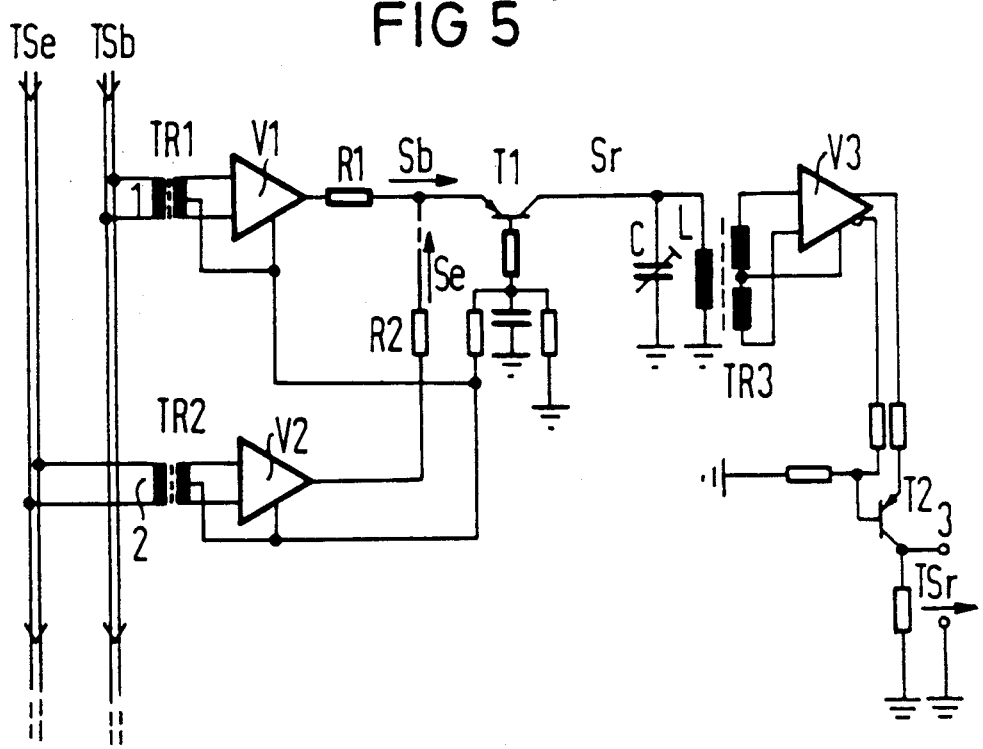
FIG. 5 is a schematic representation of an exemplary embodiment of the clock signal summing circuit.

FIG. 5 illustrates an exemplary embodiment in which the two amplifiers (line receiver) are supplied with the clock signals TSb and TSe via a pair of transformers TR1 and TR2, respectively. The outputs of the amplifiers V1 and V2 are respectively connected by way of a resistor R1 and the resistor R2 having twice the value of the resistor R1 to the emitter of the transistor T1 which operates in common base connection. The collector of the transistor T1 controls an oscillating circuit L, C, whose inductivity is generated by a third transformer TR3. To the secondary side of the transformer TR3, a third amplifier V3 is connected, whose outputs control a second transistor T2 between the emitter and the base of the transistor T2, the transistor T2 operating as a level changer which outputs, at its collector, the resulting clock signal TSr at the transistor-transistor logic (TTL) level.

Figure 6:
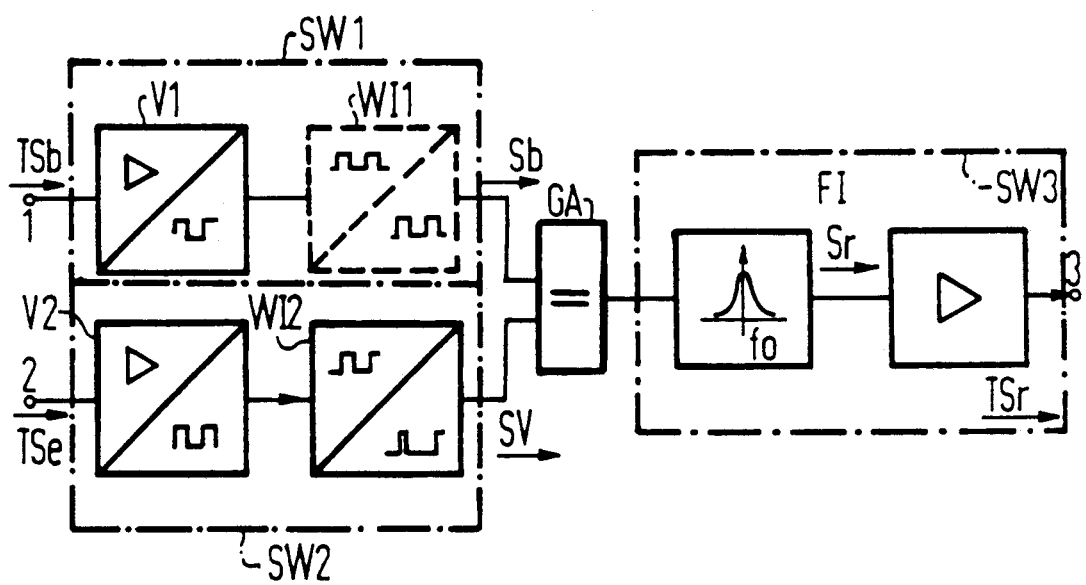
FIG. 6 is another block circuit diagram for a largely-digitalized summing circuit.

FIG. 6 illustrates a version of the clock signal summing circuit for the most part operating in digital fashion. The clock signals TSb and TSe are first transformed to a level corresponding to the circuitry used in the amplifiers V1 and V2. The output of the first amplifier V1 is connected directly with one input of a gate GA, whereas the output of the second amplifier V2 is fed to a second input of the gate GA via a signal modifier WI2. This can be an OR gate, an AND gate or an EXCLUSIVE-OR gate.

The output of the gate GA is connected to the filter FI, whose output is connected in a known manner with the third spectral conversion transducer SW3. The signal modifier WI2, for example, shortens the logical "1" of the clock signal pulses Se. If the combination via an OR gate follows, only the working clock signal TSb is switched through, if the logical "1's" of both clock signals coincide. If, however, the logical "1" of the asymmetrical clock signal TSb coincides with the logical "0" of the working clock signal, an output signal of the gate GA results modified according to the OR function. Naturally, it must be ensured that when one clock fails, the corresponding gate input is kept at the logical "0", in order to avoid blocking the other clock pulse. In the filter FI, again a discrimination with respect to the fundamental oscillation occurs, and its transformation in a resulting clock signal, in the third spectral conversion transducer SW3. Likewise also, discrimination can occur with respect to a harmonic oscillation.

The general rule for the dimensioning of the circuit arrangement here is that the spectral components to be selected should have a maximal share in order to keep the filter effort low. Should the desired spectral share not be present in the clock signals TSb, TSe, it is generated by signal modifiers WI1, WI2 as a most simple pulse duration transformer.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. In a working/standby clock pulse supply of the type in which an operating clock oscillator produces a working clock, a standby clock oscillator produces a standby clock, and in which the working clock and the standby clock are supplied to at least one assembly, the improvement therein comprising:
   at least one clock summing circuit connected to receive said working and standby clocks and including first means for combining predetermined harmonic spectral shares of various amplitudes of said clocks to form a resulting spectral signal, and second means connected to said first means and operable in response to said resulting spectral signal to produce a resulting clock.

2. The improved working/standby clock pulse supply of claim 1, wherein:
   said first means comprises first and second spectral converters respectively connected to said oscillators for converting said working and standby clocks, respectively, into spectral signals corresponding to fundamental oscillations or even harmonic oscillations.

3. The improved working/standby clock pulse supply of claim 2, wherein:
   said first and second spectral converters produce square-wave pulses with a 1:1 clock pulse ratio as spectral signals.

4. The improved working/standby clock pulse supply of claim 2, wherein:
   each of said spectral converters includes a limiter amplifier having an output; and
   a modifier connected to said output.

5. The improved working/standby clock pulse supply of claim 4, wherein:
   said first means further comprises an adder connected to said modifiers.

6. The improved working/standby clock pulse supply of claim 1, wherein:
   said predetermined harmonic shares are equal shares.

7. The improved working/standby clock pulse supply of claim 1, wherein:
   said predetermined harmonic shares are at a 2:1 ratio.

8. The improved working/standby clock pulse supply of claim 2, and further comprising:
   logic means for logically combining the outputs of said converters.

9. The improved working/standby clock pulse supply of claim 8, wherein:
   said second means comprises a third spectral converter connected to receive said resulting spectral signals, including a filter for selecting the desired harmonics.

10. The improved working/standby clock pulse supply of claim 9, wherein said filter comprises:
    an oscillatory circuit.

11. The improved working/standby clock pulse supply of claim 5, wherein:
    said adder of said clock summing circuit comprises a transistor including a base, an emitter and a collector, said transistor connected for common base operation with said collector connected to receive the output signals of said first and second spectral converters via respective resistors, and a tank circuit connected to said collector.

* * * * *